(12) United States Patent
Xiong

(10) Patent No.: US 9,853,061 B2
(45) Date of Patent: Dec. 26, 2017

(54) DISPLAY DEVICE AND MANUFACTURING METHOD THEREOF

(71) Applicant: SHENZHEN CHINA STAR OPTOELECTRONICS TECHNOLOGY CO., LTD., Shenzhen, Guangdong (CN)

(72) Inventor: Yuan Xiong, Guangdong (CN)

(73) Assignee: SHENZHEN CHINA STAR OPTOELECTRONICS TECHNOLOGY CO., LTD, Shenzhen (CN)

( * ) Notice: Subject to any disclaimer, the term of this patent is extended or adjusted under 35 U.S.C. 154(b) by 0 days.

(21) Appl. No.: 14/777,166

(22) PCT Filed: Apr. 10, 2014

(86) PCT No.: PCT/CN2014/075058
§ 371 (c)(1),
(2) Date: Oct. 1, 2015

(87) PCT Pub. No.: WO2015/096296
PCT Pub. Date: Jul. 2, 2015

(65) Prior Publication Data
US 2016/0293629 A1  Oct. 6, 2016

(30) Foreign Application Priority Data

Dec. 23, 2013 (CN) .......................... 2013 1 0719262

(51) Int. Cl.
*H01L 27/12* (2006.01)
*G02F 1/1339* (2006.01)

(52) U.S. Cl.
CPC ........ *H01L 27/124* (2013.01); *G02F 1/13394* (2013.01); *H01L 27/1262* (2013.01);
(Continued)

(58) Field of Classification Search
CPC . H01L 51/525; H01L 27/124; G02F 1/13394; G02F 2201/121; G02F 2202/16; G02F 2001/136222
See application file for complete search history.

(56) References Cited

U.S. PATENT DOCUMENTS 6,268,898 B1  7/2001  Ihara
7,570,323 B2  8/2009  Yagi et al.
(Continued)

FOREIGN PATENT DOCUMENTS

CN  101114073 A  1/2008
CN  102591072 A  7/2012
(Continued)

OTHER PUBLICATIONS

Ping Lu, the International Searching Authority written comments, dated Sep. 2014, CN.

*Primary Examiner* — Thanhha Pham

(57) ABSTRACT

The present invention discloses a display device and a manufacturing method thereof. The display device comprises an array substrate and a color filter substrate arranged opposite to the array substrate, wherein the surface of the array substrate is provided with a lining layer and a conduction layer; and the lining layer uplifts the conduction layer till the conduction layer is in contact with the color filter substrate, so that the conduction layer conducts the array substrate and the color filter substrate. Compared with a conduction structure of the existing technology in which a connector and a conductive adhesive are combined, the conduction structure of the present invention saves the material cost, reduces the machining difficulty, increases the rate of good products and finally greatly reduces the production cost, is simultaneously applicable to a narrow-bezel design of the display device and meets the aesthetic demands of users.

6 Claims, 3 Drawing Sheets

(52) U.S. Cl.
 CPC .............. *G02F 2001/13398* (2013.01); *G02F 2201/121* (2013.01); *G02F 2202/16* (2013.01)

(56) References Cited

U.S. PATENT DOCUMENTS

2004/0174476 A1\* 9/2004 Yeh .................. G02F 1/133512
 349/110
2011/0102698 A1\* 5/2011 Wang ................. G02F 1/13338
 349/54

FOREIGN PATENT DOCUMENTS

| CN | 102650763 A | 8/2012 |
|----|-------------|---------|
| CN | 102681237 A | 9/2012 |
| CN | 103293774 A | 9/2013 |
| CN | 103424906 A | 12/2013 |
| CN | 103698921 A | 4/2014 |

\* cited by examiner

DISPLAY DEVICE AND MANUFACTURING METHOD THEREOF

FIELD OF THE INVENTION

The present invention relates to the field of a display technology, in particular to a display device and a manufacturing method of the display device.

BACKGROUND OF THE INVENTION

An existing display device, as shown in FIG. 1, comprises an array substrate 10 and a color filter (CF) substrate 20 which are oppositely arranged and between which gold beads 40 are filled, wherein a connector 30 is arranged on the array substrate 10, and a conductive adhesive (not shown in FIG.) is arranged around the array substrate 10. Common electrodes of the array substrate 10 and the color filter substrate 20 are conducted through the combination of the connector 30 and the conductive adhesive. Higher adhesive dispensing precision is needed for the design of said conduction structure, and thus the rate of good products is lower and the production cost is higher; in addition, the connector 30 is larger in size, and is thus not applicable to the narrow-bezel design of the display device and incapable of meeting the aesthetic demands of users.

SUMMARY OF THE INVENTION

The present invention mainly aims at provides a display device and a manufacturing method thereof, and an objective thereof is to improve the conduction structure and reduce the production cost.

In order to achieve the objective aforementioned, the present invention provides a display device which comprises an array substrate and a color filter substrate arranged opposite to the array substrate and is characterized in that the surface of the array substrate is provided with a lining layer and a conduction layer, wherein the lining layer uplifts the conduction layer till the conduction layer is in contact with the color filter substrate, so that the conduction layer conducts the array substrate and the color filter substrate; and the lining layer refers to at least two color filter layers.

Preferably, the conduction layer is a metal layer or an indium tin oxide layer.

The present invention also provides a display device under the same invention concept, comprising an array substrate and a color filter substrate arranged opposite to the array substrate, wherein the surface of the array substrate is provided with a lining layer and a conduction layer, and the lining layer uplifts the conduction layer till the conduction layer is in contact with the color filter substrate, so that the conduction layer conducts the array substrate and the color filter substrate.

Preferably, the conduction layer is a metal layer or an indium tin oxide layer.

Preferably, the conduction layer is an indium tin oxide layer, the surface of the array substrate is also provided with a metal layer connected with a common electrode of the array substrate, and the indium tin oxide is indirectly connected with the common electrode through connecting with the metal layer.

Preferably, the conduction layer is a second metal layer, the surface of the array substrate is also provided with a first metal layer connected with the common electrode of the array substrate and an indium tin oxide layer connected with the first metal layer, and the second metal layer is indirectly connected with said common electrode through connecting with the indium tin oxide layer.

Preferably, the surface of the color filter substrate is provided with an indium tin oxide layer connected with the common electrode of the color filter substrate, and the conduction layer is indirectly connected with the common electrode of the color filter substrate through contacting the indium tin oxide layer of the color filter substrate.

Preferably, the conduction layer is directly connected with the common electrode of the array substrate or/and the common electrode of the color filter substrate.

Preferably, the lining layer is color filter layers, a black matrix layer or a photo spacer layer.

Preferably, the lining layer refers to at least two color filter layers.

The invention provides a manufacturing method of the display device at the same time, comprising the following steps:

forming a lining layer on an array substrate;

forming a conduction layer on the array substrate, wherein the conduction layer partially covers the surface of the lining layer; and enabling the color filter substrate to prop against the part, covering the surface of the lining layer, of the conduction layer, so that the conduction layer conducts the array substrate and the color filter substrate.

Preferably, the lining layer refers to at least color filter layers.

Preferably, the conduction layer is a metal layer or an indium tin oxide layer.

Preferably, the step of forming the conduction layer on the array substrate comprises:

forming the indium tin oxide on the array substrate as the conduction layer, wherein the indium tin oxide layer partially covers the surface of the lining layer and is directly connected with the common electrode of the array substrate.

Preferably, the step of forming the conduction layer on the array substrate comprises:

forming a second metal layer on the array substrate as the conduction layer, wherein the second metal layer partially covers the surface of the lining layer and is directly connected with the common electrode of the array substrate.

The display device provided by the present invention makes full use of the metal layer or indium tin oxide layer in an array substrate manufacturing procedure as the conduction layer, and the lining layer is used to uplift the conduction layer till the conduction layer is in contact with the color filter substrate, so that the common electrodes of the array substrate and the color filter substrate are conducted through the conduction layer. Compared with a conduction structure of the existing technology in which a connector and a conductive adhesive are combined, the conduction structure of the present invention saves the material cost, reduces the machining difficulty, increases the rate of good products and finally greatly reduces the production cost, is simultaneously applicable to a narrow-bezel design of the display device and meets the aesthetic demands of users.

The realization of the objectives, the functional characteristics and the advantages of the present invention will be further illustrated in conjunction with the embodiments and by reference to the drawings.

DETAILED DESCRIPTIONS OF THE PREFERRED EMBODIMENTS

It should be understand that the specific embodiments described hereby are just used to interpret the present invention, rather than limit the present invention.

The display device disclosed by the invention realizes the conduction of the array substrate and the color filter substrate by virtue of the combination of the color filter layers and the conduction layer instead of the combination of the connector and the conductive adhesive. Wherein, the conduction layer can be a metal layer or an indium tin oxide layer (ITO) in an array substrate manufacturing procedure, and the lining layer can be color filter (CF) layers, a black matrix (BM) layer, a photo spacer (PS, also called a support column) layer or other photoresistive materials.

Figure 1:
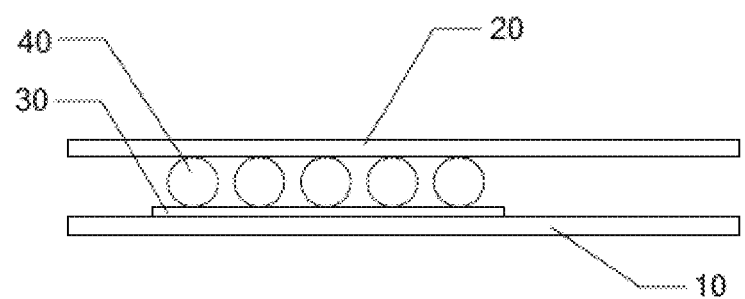
FIG. 1 is a schematic drawing of the conduction structure of the display device of the prior art.
Figure 2:
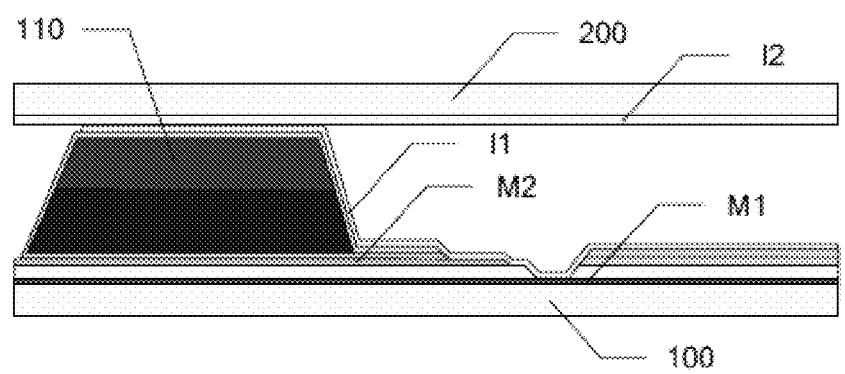
FIG. 2 is a structural schematic drawing of Embodiment I of the display device of the present invention.

As shown in FIG. 2, Embodiment 1 of the display device of the present invention is proposed, and the indium tin oxide layer is used as a conduction layer in this embodiment. The display device comprise an array substrate 100 and a color filter substrate 200 arranged opposite to the array substrate 100, wherein the surface of the color filter substrate 200 is provided with an indium tin oxide layer I2 which is connected with a common electrode of the color filter substrate 200; a first metal layer M1, a second metal layer M2, color filter layers 110 and an indium tin oxide layer I1 are sequentially formed on the surface of the array substrate 100 from bottom to top, and protection layers, passivation layers and the like are also arranged among all the layers. A part (the left side) of the indium tin oxide layer I1 covers the surface of the lining layer 110, so that the lining layer 110 uplifts the indium tin oxide layer I1 till the indium tin oxide layer I1 is in contact with the indium tin oxide layer I2 of the color filter substrate 200; the other part (the right side) of the indium tin oxide layer I1 is respectively connected with the first metal layer M1 and the second metal layer M2. The indium tin oxide layer I1 can be directly connected with the common electrode of the array substrate 100; or the first metal layer M1 is connected with the common electrode of the array substrate 100, and the indium tin oxide layer I1 is indirectly connected with the common electrode of the array substrate 100 through connecting with the first metal layer M1; or the second metal layer M2 is connected with the common electrode of the array substrate 100, and the indium tin oxide layer I1 is indirectly connected with the common electrode of the array substrate 100 through connecting with the second metal layer M2. Therefore, the indium tin oxide layer I1 one end of which is in contact with the indium tin oxide layer I2 of the color filter substrate 200 and further indirectly connected with the common electrode of the color filter substrate 200, and the other end of which is directly and indirectly connected with the common electrode of the array substrate 100, is used as the conduction layer, so that the purpose of conducting the array substrate 100 and the color filter substrate 200 is realized.

The lining layer 110 can be color filter layers, a black matrix layer, a photo spacer layer or other photoresistive materials, it is preferred to select the color filter layers in this embodiment since the color filter layers can be stacked more stably and flatly, and one layer, two layers or more layers, preferably two to three layers of color filter layers which can be the same or different in color can be selected according to practical situations, and are hereby not limited; and the stacking mode and the stacking shape of the color filter layers are different, and are hereby not limited.

In some embodiments, the indium tin oxide layer I1 as the conduction layer can be directly connected with the common electrode of the color filter substrate 200.

Figure 3:
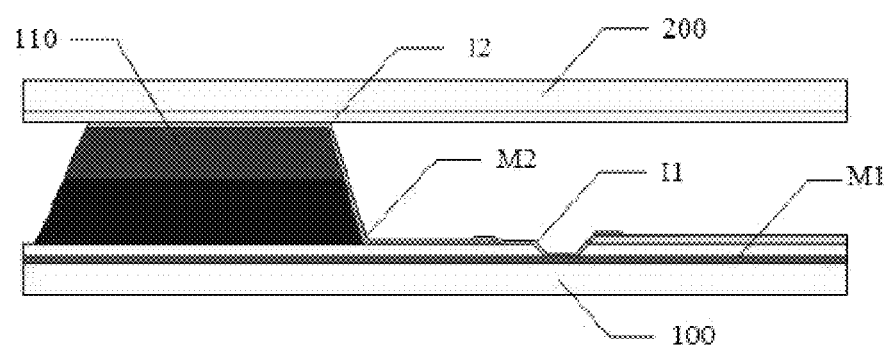
FIG. 3 is a structural schematic drawing of Embodiment I of the display device of the present invention.

As shown in FIG. 3, Embodiment 2 of the present invention is proposed, and the second metal layer of Embodiment 2 is used as a conduction layer. The display device comprise an array substrate 100 and a color filter substrate 200 arranged opposite to the array substrate 100, wherein the surface of the color filter substrate 200 is provided with an indium tin oxide layer I2 which is connected with a common electrode of the color filter substrate 200; a first metal layer M1, color filter layers 110, a second metal layer M2 and an indium tin oxide layer I1 are sequentially formed on the surface of the array substrate 100 from bottom to top, and protection layers, passivation layers and the like are also arranged among all the layers. A part (the left side) of the second metal layer M2 covers the surface of the lining layer 110, so that the lining layer 110 uplifts the second metal layer M2 till the second metal layer M2 is in contact with the indium tin oxide layer I2 of the color filter substrate 200; the other part (the right side) of the second metal layer M2 is connected with the indium tin oxide layer I1 which is connected with the first metal layer M1. The second metal layer M2 can be directly connected with the common electrode of the array substrate 100; or the indium tin oxide layer I1 or the first metal layer M1 is connected with the common electrode of the array substrate 100, and the second metal layer M2 is indirectly connected with the common electrode of the array substrate 100 through connecting with the indium tin oxide layer I1. Therefore, the second metal layer M2 one end of which is in contact with the indium tin oxide layer I2 of the color filter substrate 200 and indirectly connected with the common electrode of the color filter substrate 200, and the other end of which is directly or indirectly connected with the common electrode of the array substrate 100, is used as the conduction layer, so that the purpose of conducting the array substrate 100 and the color filter substrate 200 is realized. Relative to the indium tin oxide layer I1, the second metal layer M2 has better ductility and tenacity and is unlikely to break, and thus the two substrates can be conducted more stably by taking the second metal layer M2 as the conduction layer.

The lining layer 110 can be color filter layers, a black matrix layer, a photo spacer layer or other photoresistive materials. It is preferred to select the color filter layers in this embodiment since the color filter layers can be stacked more stably and flatly, and one layer, two layers or more layers, preferably two to three layers of color filter layers which can be the same or different in color can be selected according to practical situations, and are hereby not limited; and the stacking mode and the stacking shape of the color filter layers are different, and are hereby not limited.

In some embodiments, the second metal layer M2 as the conduction layer can also be directly connected with the common electrode of the color filter substrate 200.

Accordingly, the display device provided by the present invention makes full use of the metal layer or indium tin oxide layer in an array substrate manufacturing procedure as the conduction layer, and the lining layer is used to uplift the conduction layer till the conduction layer is in contact with the color filter substrate, so that the common electrodes of the array substrate and the color filter substrate are conducted through the conduction layer. Compared with a conduction structure of the existing technology in which a connector and a conductive adhesive are combined, the conduction structure of the present invention saves the material cost, reduces the machining difficulty, increases the rate of good products and finally greatly reduces the production cost, is simultaneously applicable to a narrow-bezel design of the display device and meets the aesthetic demands of users.

Figure 4:
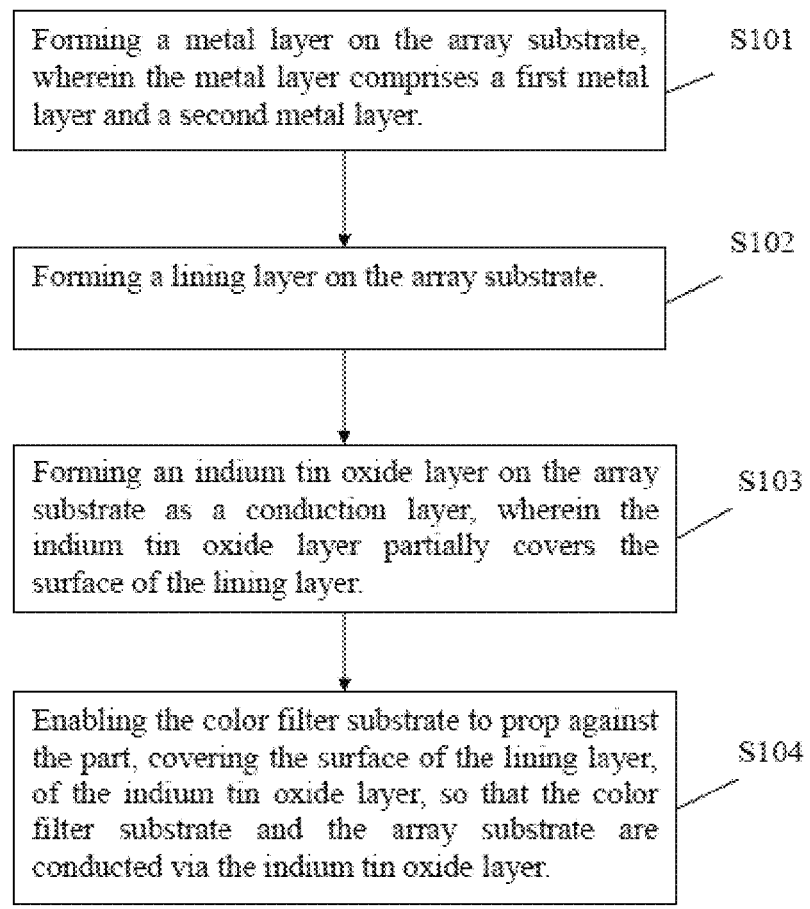
FIG. 4 is a flow diagram of one embodiment of the manufacturing method of the display device of the present invention.

The manufacturing method of the display device is proposed in conjunction with FIG. 2 and FIG. 4, comprising the following steps:

S101, forming a metal layer on the array substrate, wherein the metal layer comprises a first metal layer and a second metal layer, to be specific, in the step S101, the metal layer which can be of a multilayer structure of metal, alloy or both, preferably a molybdenum/aluminum/molybdenum multilayer structure, is formed in a sputtering or other physical vapor deposition manner. Firstly, a first metal layer M1 is formed on the array substrate 100 and is patterned in a photoetching or etching manner, a passivation layer (GI) is formed on the first metal layer M1, and then an opening is formed on the passivation layer (GI) to expose a part of first metal layer M1; and then an amorphous silicon layer (AS) is formed on the passivation layer (GI) on one side (the right side) of the opening and is patterned, a second metal layer M2 is formed on the passivation layer on the other side (the left side) of the opening and is patterned, and a passivation layer (PVI) is formed on the second metal layer M2.

S102, forming a lining layer on the array substrate, wherein, in the step S102, a lining layer 110 is formed (coated) on the passivation layer (PVI) of the array substrate 100 and is patterned to form a passivation layer (PV2), and then via hole patterning is performed. The lining layer 110 can be color filter layers, a black matrix layer, a photo spacer layer or other photoresistive materials. It is preferred to select the color filter layers in this embodiment since the color filter layers can be stacked more stably and flatly, and one layer, two layers or more layers, preferably two to three layers of color filter layers which can be the same or different in color can be selected according to practical situations, and are hereby not limited; and the stacking mode and the stacking shape of the color filter layers are different, and are hereby not limited.

S103, forming an indium tin oxide layer on the array substrate as a conduction layer, wherein the indium tin oxide layer partially covers the surface of the lining layer, to be specific, in the step S103, the indium tin oxide layer I1 is formed on the array substrate and is patterned, wherein a part (the left side) of the indium tin oxide layer I1 is formed on the lining layer 110 of the array substrate 100, so that the lining layer 110 uplifts the indium tin oxide layer I1; and the other part of the indium tin oxide layer I1 extends rightwards to be connected with the second metal layer and is connected with the first metal layer through said opening.

The indium tin oxide layer I1 as the conduction layer can be directly connected with the common electrode of the array substrate 100; or the first metal layer M1 is connected with the common electrode of the array substrate 100, and the indium tin oxide layer I1 is indirectly connected with the common electrode of the array substrate 100 through connecting with the first metal layer M1; or the second metal layer M2 is connected with the common electrode of the array substrate 100, and the indium tin oxide layer I1 is indirectly connected with the common electrode of the array substrate 100 through connecting with the second metal layer M2.

S104, enabling the color filter substrate to prop against the part, covering the surface of the lining layer, of the indium tin oxide layer, so that the color filter substrate and the array substrate are conducted through the indium tin oxide layer, wherein, the indium tin oxide layer I2 is generally formed on the color filter substrate 200 and is connected with the common electrode of the color filter substrate 200. The manufactured color filter substrate 200 is arranged opposite to the array substrate 100, so that the color filter substrate 200 props against the indium tin oxide layer I1 of the array substrate 100, and thus the indium tin oxide I1 is in contact with the indium tin oxide layer I2 of the color filter substrate 200. Therefore, the indium tin oxide layer I1 one end of which is in contact with the indium tin oxide layer I2 of the color filter substrate 200 and indirectly connected with the common electrode of the color filter substrate 200, and the other end of which is directly or indirectly connected with the common electrode of the array substrate 100, is used as the conduction layer, and thus the purpose of conducting the array substrate 100 and the color filter substrate 200 is realized.

Wherein, the manufacturing procedure of the color filter substrate 200 is appropriately as follows: forming (coating) the black matrix on the color filter substrate 200 and patterning the black matrix layer, then forming an indium tin oxide layer I2 through deposition, and finally forming (coating) the photo spacer layer and patterning the photo spacer layer.

In some embodiments, the indium tin oxide layer I1 as the conduction layer can be also directly connected with the common electrode of the color filter substrate 200.

In some embodiments, the second metal layer M2 of the array substrate 100 can be used as the conduction layer as shown in FIG. 3. At this moment, a part of the second metal layer M2 covers the surface of the lining layer 110 and is in contact with the color filter substrate 200 and is directly connected with the common electrode of the color filter substrate 200, or is indirectly connected with the common electrode of the color filter substrate 200 through the indium tin oxide layer I2 on the color filter substrate 200. The other part of the second metal layer M2 can be directly connected with the common electrode of the array substrate 100; or the indium tin oxide layer I1 or the first metal layer M1 is connected with the common electrode of the array substrate 100, and the second metal layer M2 is indirectly connected with the common electrode of the array substrate 100 through connecting with the indium tin oxide layer I1. Therefore, the second metal layer M2 one end of which is in contact with the color filter substrate and directly or indirectly connected with the common electrode of the color filter substrate 200, and the other end of which is directly or indirectly connected with the common electrode of the array substrate 100, is used as the conduction layer, and thus the purpose of conducting the array substrate 100 and the color filter substrate 200 is realized as well.

Accordingly, in the manufacturing method of the display device provided by the present invention, the metal layer or indium tin oxide layer in an array substrate manufacturing procedure is used as the conduction layer, and the lining layer is used to uplift the conduction layer till the conduction layer is in contact with the color filter substrate, so that the common electrodes of the array substrate and the color filter substrate are conducted through the conduction layer. Compared with the existing technology in which a connector and a conductive adhesive are combined, the present invention saves the material cost, reduces the machining difficulty, increases the rate of good products and finally greatly reduces the production cost, is simultaneously applicable to a narrow-bezel design of the display device and meets the aesthetic demands of users.

It should be understand that those stated as above are just preferred embodiments of the present invention and are thus incapable of limiting the patent scope of the present invention, and equivalent structures or equivalent flow transformations made by use of contents of the description and the drawings of the present invention and directly or indirectly applied to other related technical fields should fall within the patent protection scope of the present invention in the same way.

What is claimed is:

1. A display device, comprising an array substrate and a color filter substrate arranged opposite to the array substrate, wherein a surface of said array substrate is provided with a lining layer and a conduction layer, and said lining layer uplifts said conduction layer till said conduction layer is in contact with said color filter substrate, so that said conduction layer conducts said array substrate and said color filter substrate, wherein said conduction layer refers to a second metal layer, the surface of said array substrate is also provided with a first metal layer connected with a common electrode of said array substrate and an indium tin oxide layer connected with said first metal layer, and said second metal layer is indirectly connected with said common electrode of said array substrate through connecting with said indium tin oxide layer.

2. The display device according to claim 1, wherein said conduction layer refers to a metal layer or an indium tin oxide layer.

3. The display device according to claim 1, wherein said conduction layer is directly connected with the common electrode of said array substrate or/and a common electrode of the color filter substrate.

4. The display device according to claim 1, wherein said lining layer refers to color filter layers, a black matrix layer or a photo spacer layer.

5. The display device according to claim 1, wherein said lining layer refers to at least two color filter layers.

6. A display device, comprising an array substrate and a color filter substrate arranged opposite to the array substrate, wherein a surface of said array substrate is provided with a lining layer and a conduction layer, and said lining layer uplifts said conduction layer till said conduction layer is in contact with said color filter substrate, so that said conduction layer conducts said array substrate and said color filter substrate, wherein a surface of said color filter substrate is provided with an indium tin oxide layer connected with a common electrode of said color filter substrate, and said conduction layer is indirectly connected with the common electrode of said color filter substrate through contacting the indium tin oxide layer of said color filter substrate.

* * * * *